United States Patent [19]

Tai

[11] Patent Number: 5,483,192
[45] Date of Patent: Jan. 9, 1996

[54] GATE POWER SUPPLY CIRCUIT

[75] Inventor: Hiromichi Tai, Tokyo, Japan

[73] Assignee: Kabushiki Kaisha Toshiba, Kawasaki, Japan

[21] Appl. No.: 116,970

[22] Filed: Sep. 7, 1993

[30] Foreign Application Priority Data

Sep. 17, 1992 [JP] Japan .................................. 4-246991

[51] Int. Cl.$^6$ ........................... H03K 17/60; H03K 17/73; H02H 7/122; H02M 5/42
[52] U.S. Cl. ........................... 327/440; 327/441; 327/442; 327/443; 327/470; 363/57; 363/85; 363/96
[58] Field of Search ............................... 327/436, 438, 327/440, 441, 442, 443, 445, 460, 468, 470, 475; 363/54, 57, 58, 71, 85, 96, 137

[56] References Cited

U.S. PATENT DOCUMENTS

| | | | |
|---|---|---|---|
| 4,703,411 | 10/1987 | Umbricht | 363/57 |
| 4,725,941 | 2/1988 | Watanabe | 363/87 |

FOREIGN PATENT DOCUMENTS

| | | |
|---|---|---|
| 0009225 | 4/1980 | European Pat. Off. . |
| 2750720 | 5/1979 | Germany . |
| 4113603 | 5/1992 | Germany . |
| 1-208911 | 8/1989 | Japan . |

OTHER PUBLICATIONS

IEEE Transactions on Power Delivery, vol. 5, No. 3, Jul. 1990, pp. 1327–1335, H. Yamada, et al., "GTO Thyristor Applications for HVDC Transmission Systems".

Primary Examiner—Timothy P. Callahan
Assistant Examiner—Trong Phan
Attorney, Agent, or Firm—Oblon, Spivak, McClelland, Maier & Neustadt

[57] ABSTRACT

A gate power supply circuit including a switching device and a gate drive circuit connected to the switching device for generating a gate signal to be supplied to a gate of the switching device. The gate power supply circuit further includes a series circuit of a snubber capacitor and a snubber diode connected in parallel with the switching device, and an inductor, a first terminal of which is connected to a connection point of the switching device and the snubber diode. The gate power supply circuit also includes a series circuit of power disposing circuit and a first diode, connected between a series connection point of the snubber capacitor and the snubber diode and a second terminal of the inductor. The gate power supply circuit further includes a series circuit of a power supplying capacitor and a second diode, connected in parallel with the inductor. The gate drive circuit is connected to the power supplying capacitor to receive energy stored in the power supplying capacitor as power source for the gate drive circuit.

11 Claims, 5 Drawing Sheets

GATE POWER SUPPLY CIRCUIT

BACKGROUND OF THE INVENTION

1. Field of the Invention

This invention relates to a gate power supply circuit, and more particularly to a gate power supply circuit that supplies gate power to the gate drive circuit for a self-turn-off device from a main circuit, utilizing the switching action of a self-turn-off device etc.

2. Description of the Related Art

By employing self-turn-off devices in a power converter such as an inverter, the benefits are obtained of better suppression of source side and load side harmonics than hitherto, improvement of the power source power factor, and device miniaturization, etc. Hitherto, it was impossible to obtain self-turn-off devices suited for high voltage and larger current use. Recently however, it has become possible to manufacture self-turn-off devices typified by GTOs suited for high voltage and large current use. Application of self-turn-off devices to the high power field as therefore become common.

When applying self-turn-off devices such as GTOs to high voltage applications, the problem of the drive power source of the gate drive circuit of the self-turn-off device cannot be neglected. This problem is particularly severe in the case of GTOs constituting switching elements mainly employed in the high power field. The reason for this is that a GTO is a current-controlled device, yet the degree of current amplification on turn-off is small, so, on turn-off, a very large current the amplitude of which is about one third through one fifth of that of the main circuit current, must be supplied to the gate of the GTO. Furthermore, even when the GTO is ON, current to the gate must be continued in order to reduce conduction loss. The power consumption of the gate drive circuit of a GTO is therefore at least 100 W per GTO, although this does vary depending on the type of GTO.

Since the gate drive circuit of a GTO is directly connected to the cathode and gate of the GTO that is being driven, it is electrically at the same potential as the cathode of the GTO that is being driven. When GTOs are connected in series, the gate drive circuit of each GTO is at a respectively different potential, so the power sources of the respective gate drive circuits must be at respectively different potentials. This means that the power sources of the gate drive circuits of the GTOs must be mutually insulated for each respective GTO.

Figure 9:
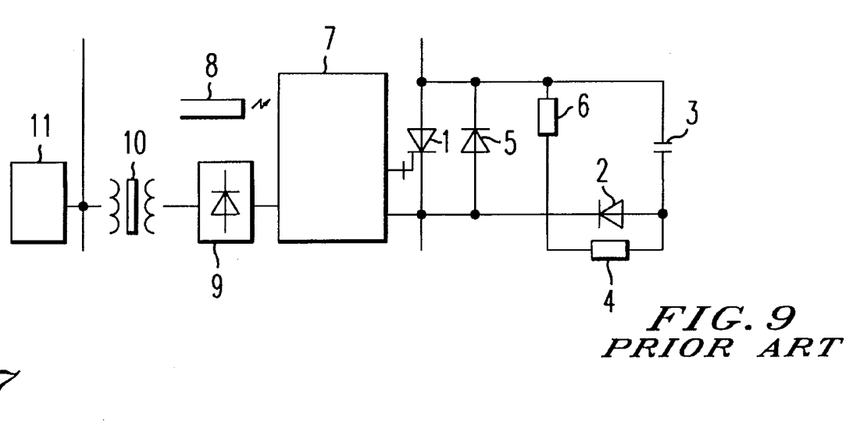
FIG. 9 is a layout diagram showing a prior art gate power supply circuit.

An example of a conventionally used GTO gate drive circuit is shown in FIG. 9. FIG. 9 shows a single GTO of a plurality of GTOs constituting a power converter and the associated snubber circuit and gate drive circuit.

In FIG. 9, a GTO 1 is the main switching device. A snubber diode Z and a snubber capacitor 3 constitute a snubber circuit for suppressing the rate of voltage rise when GTO 1 is turned OFF, and suppress GTO loss on turn-off. A resistor 4 dissipates the energy stored in snubber capacitor 3. A diode 5 is a free-wheeling diode that provides a current path for the main circuit current in regeneration mode. A resistor 6 is a DC balance resistor that performs the action of balancing the DC voltages apportioned to each GTO when a large number of GTOs are connected in series, so that they are not affected by the slight variations of the characteristics of each GTO.

The gate of GTO 1 is driven by a gate drive circuit 7. The ON/OFF signal of the gate is transmitted as an optical signal by an optical fiber 8 and is converted to an electrical signal by a photoreceptor module, not shown, in gate drive circuit 7. Since an optical signal is employed, the ON/OFF gate signals are automatically insulated for each GTO 1. Regarding the power source of gate drive circuit 7, this can be obtained by using a rectifier 9 to produce DC power by rectifying the high frequency (such as 20 kHz) AC power supplied from a high frequency AC power source 11 through an isolating transformer 10. High frequency AC power source 11 is located in a low potential zone and is supplied in common to each GTO; the difference in potential between GTOs 1 is insulated by means of isolating transformer 10 corresponding to each respective GTO 1.

However, there ape considerable problems in applying the prior art to power converters in which a large number of GTOs are connected in series and the DC bus voltage exceeds a few tens of kV. This is because a large number of isolating transformers capable of withstanding a high voltage of a few tens of kV to be isolated across their poles and capable of insulating the high voltage are required in order to achieve delivery of high frequency AC power through isolating transformers 10 from the low potential zone. Not only do such isolating transformers require a large amount of space, but in addition they are enormously expensive. There were therefore problems on grounds of space and cost in applying the prior art to high voltage application, such as power converters, in which a large number of GTOs were connected in series.

SUMMARY OF THE INVENTION

Accordingly, one object of this invention is to provide a gate power supply circuit which can dispense with an isolating transformer and enables miniaturization and cost reduction of a power converter constructed using self-turnoff devices.

These and other objects of this invention can be achieved by providing a gate power supply circuit including a switching device and a gate drive circuit connected to the switching device for generating a gate signal to be supplied to a gate of the switching device. The gate power supply circuit further includes a series circuit of a snubber capacitor and a snubber diode connected in parallel with the switching device, and an inductor, a first terminal of which is connected to a connection point of the switching device and the snubber diode. The gate power supply circuit also includes a series circuit of power disposing circuit and a first diode, connected between a series connection point of the snubber capacitor and the snubber diode and a second terminal of the inductor. The gate power supply circuit further includes a series circuit of a power supplying capacitor and a second diode, connected in parallel with the inductor. The gate drive circuit is connected to the power supplying capacitor to receive energy stored in the power supplying capacitor as power source for the gate drive circuit.

According to one aspect of this invention, there is provided a gate power supply circuit including a plurality of valve units, an inductor having a first terminal and a second terminal and a power disposing circuit. A first terminal of the power disposing circuit is connected to the second terminal of the inductor. Each of the valve units includes a switching device, a gate drive circuit connected to the switching device for generating a gate signal to be supplied to a gate of the switching device, a series circuit of a snubber capacitor and a snubber diode connected in parallel with the switching device, a first diode, a first terminal of which being connected to a series connection point of the snubber capacitor and the snubber diode, and a series circuit of a power supplying capacitor and a second diode. A first terminal of the power supplying capacitor is connected to a connection point of the switching device and the snubber diode, and a second terminal of the power supplying capacitor is connected to a first terminal of the second diode. The gate drive circuit is connected to the power supplying capacitor to receive energy stored in the power supplying capacitor as power source for the gate drive circuit. A plurality of the valve units and the inductor are connected in series, such that a plurality of the switching devices are connected in series, and the inductor is connected in series with the series connected switching devices such that the first terminal of the inductor is connected to the connection point of the switching device and the snubber diode of the valve unit in a last stage. A second terminal of the first diode of the valve unit in a stage except the last stage is connected to the first terminal of the first diode of the valve unit in a next stage, and a second terminal of the first diode of the valve unit in the last stage is connected to a second terminal of the power disposing circuit. A second terminal of the second diode of the valve unit in the stage except the last stage is connected to the first terminal of the second diode of the valve unit in the next stage, and a second terminal of the second diode of the valve unit in the last stage is connected to a second terminal of the inductor.

Consequently, the feature of this invention is to provide a gate power supply circuit so arranged that power supplied to the gate drive circuit is obtained from the main circuit by utilizing to ON/OFF action of the self-turn-off device, dispensing with an isolating transformer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Referring now to the drawings, wherein like reference numerals designate identical or corresponding parts throughout the several views, the embodiments of this invention will be described below.

Figures 1, 2:
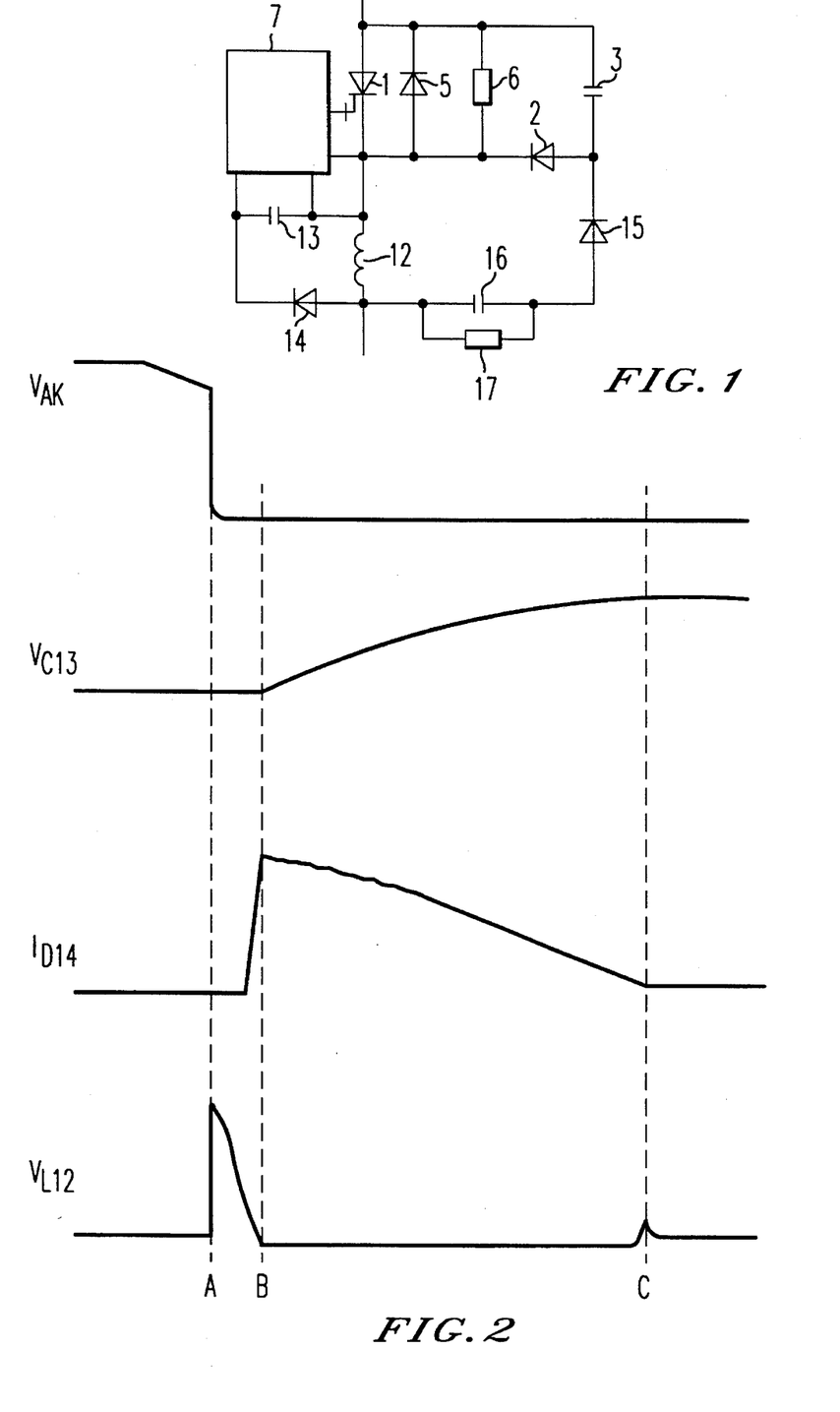
FIG. 1 is a layout diagram showing a gate power supply circuit according to a first embodiment of this invention.
FIG. 2 is an operating waveform diagram given in explanation of the operation of the gate power supply circuit of FIG. 1.

FIG. 1 is a layout diagram showing a gate power supply circuit according to a first embodiment of this invention. In this FIG. 1 is a self-turn-off device (hereinbelow referred to as GTO 1) of the main circuit. A snubber circuit consisting of the series circuit of a snubber diode 2 and snubber capacitor 3, free-wheeling diode 5 and DC balance resistor 6 are connected in parallel with GTO 1. One terminal of an inductor 12 is connected to the cathode side of GTO 1, while a series circuit consisting of a first diode 15 and a first capacitor 16 is connected between the other terminal of inductor 12 and the series connection point of snubber diode 2 and snubber capacitor 3, and a resistor 17 is connected in parallel with capacitor 16. Furthermore, a series circuit consisting of a power supplying capacitor, such as a second capacitor 13, and a second diode 14 is connected in parallel with inductor 12, so that the energy stored in second capacitor 13 is fed to gate drive circuit 7.

The operation of this invention constructed as above will now be described with reference to FIG. 2. In FIG. 2, VAK is a voltage between an anode and a cathode of GTO 1, VC13 is a voltage of second capacitor 13, ID14 is a current flowing through second diode 14 and VL12 is a voltage of inductor 12.

Whilst GTO 1 is OFF, snubber capacitor 3 is charged through snubber diode 2 and inductor 12 practically up to the DC apportioned voltage VAK of GTO 1.

At time point A in FIG. 2, GTO 1 is turned ON and voltage VAK of GTO 1 drops. Simultaneously, first diode 15 conducts, and the charge of snubber capacitor 3 is discharged by the loop: GTO 1→inductor 12→first capacitor 16→first diode 15. Since the voltage VAK of GTO 1 rapidly approaches zero, voltage VL12 of inductor 12 becomes directly that of snubber capacitor 3. Discharge of snubber capacitor 3 terminates at time point B. After time point B, the current of inductor 12 flows in the first loop: inductor 12→first capacitor 16→first diode 15→snubber diode 2→inductor 12, and in the second loop: inductor 12 second diode 14→second capacitor 13→inductor 12. Thereby, second capacitor 13 is charged, and the voltage VC13 of second capacitor 13 rises. At the time point C where the current in inductor 12 that flows due to the snubber energy becomes zero, the snubber energy that has been transferred to inductor 12 has all completed its transfer to first capacitor 16 and second capacitor 13. The energy stored in first capacitor 16 is dissipated by resistor 17 and the energy stored in second capacitor 13 is supplied to gate drive circuit 7.

If first capacitor 16 of sufficiently large capacity is employed, the voltage of first capacitor 16 always maintains a practically constant voltage level. Since the charged voltage of second capacitor 13 is equal to the voltage of first capacitor 16, if the value of first capacitor 16 is made sufficiently large, every time GTO 1 is turned ON, the voltage of second capacitor 13 will be charged up to a fixed voltage equal to the voltage of first capacitor 16. In this case, the voltage of first capacitor 16 is determined by the value of resistor 17 and the input power to first capacitor 16 that is determined by the switching frequency of GTO 1 and the energy stored in snubber capacitor 3 during the period while GTO 1 is OFF.

In this embodiment, the energy stored in the power supplying capacitor, such as second capacitor 13, is supplied to gate drive circuit 7, so that an isolating transformer of high withstand voltage that is necessary in the prior art shown in FIG. 9 can be omitted.

Figure 3:
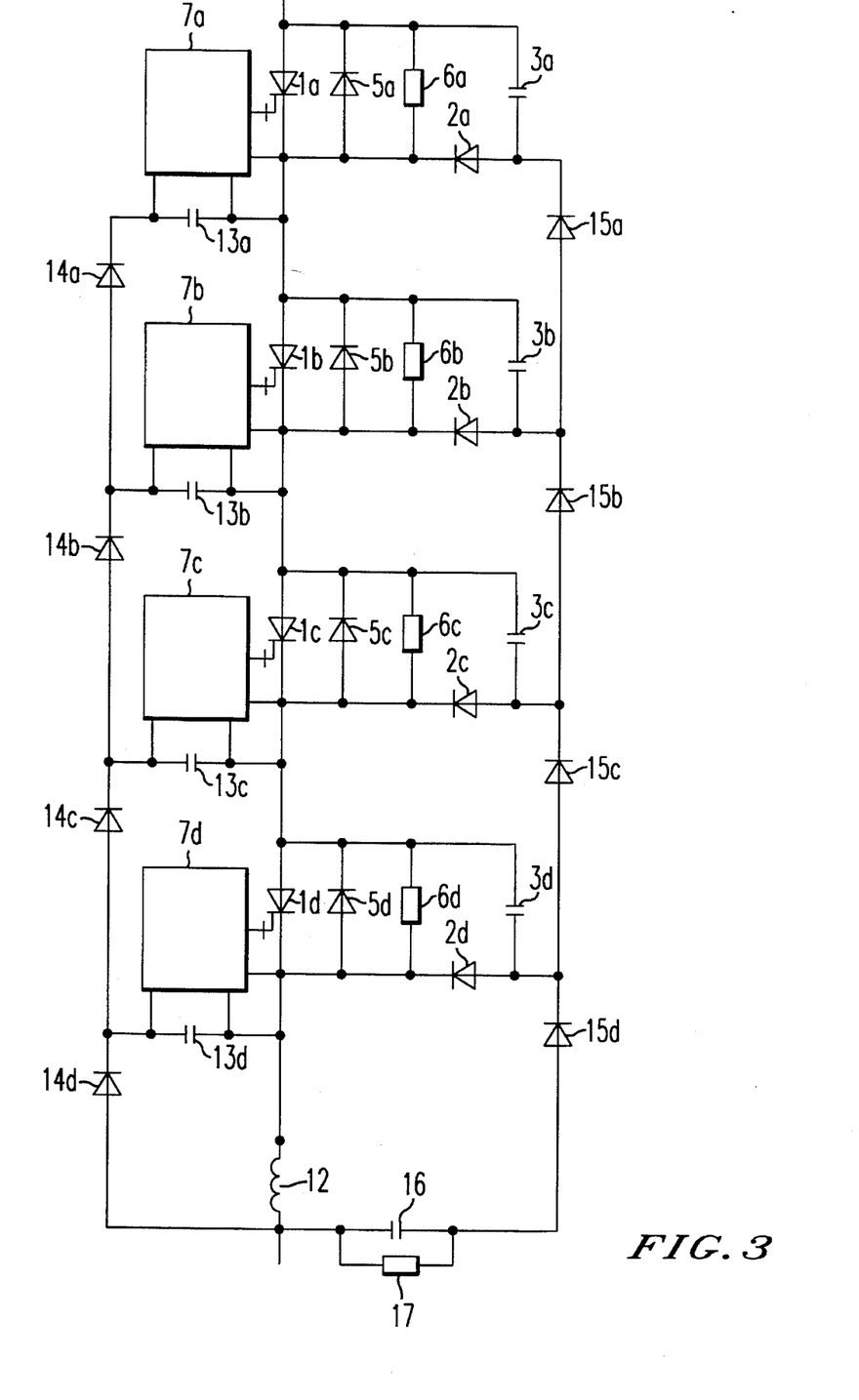
FIG. 3 is a layout diagram showing a gate power supply circuit according to a second embodiment of this invention.

FIG. 3 is a layout diagram showing a gate power supply circuit according to a second embodiment of this invention. In this second embodiment, a single switching valve is constituted by connecting in series four,GTOs 1a, 1b, 1c and 1d that are driven by the same Gate signal. It is to be noted that, in this specification, suffixs a, b, c and d are attached to reference numerals indicating components in valve units a, b, c and d constituting a single switching valve, respectively. In the case of high voltage applications wherein a large number of switching devices are connected in series, the arm of a power converter is constituted by further connecting a large number of the switching valves thereby obtained in series. In the second embodiment, the rate of current rise of the GTO is suppressed by a single anode inductor 12 provided in a single switching valve. Even in the case of the gate power supply circuit of this invention, a single anode inductor 12 is used in common with four gate supply circuits.

What is important in the operation of the second embodiment is series-connected second diodes 14a, 14b, 14c and 14d and first diodes 15a, 15b, 15c and 15d. Whilst GTOs 1a, 1b, 1c and 1d are OFF, these diodes are reverse-biased, and so do not conduct, with the result that the GTOs 1a to 1d are respectively isolated. When GTOs 1a to 1d are turned ON, these diodes conduct during the period in which the current of inductor 12 flows in the respective diodes, and snubber capacitors 3a, 3b, 3c and 3d are equivalently connected in parallel also, second capacitors 13a, 13b, 13c and 13d have a configuration in which they are equivalently connected in parallel. The operation of this second embodiment will now be described in detail with reference to FIG. 4.

Figure 4:
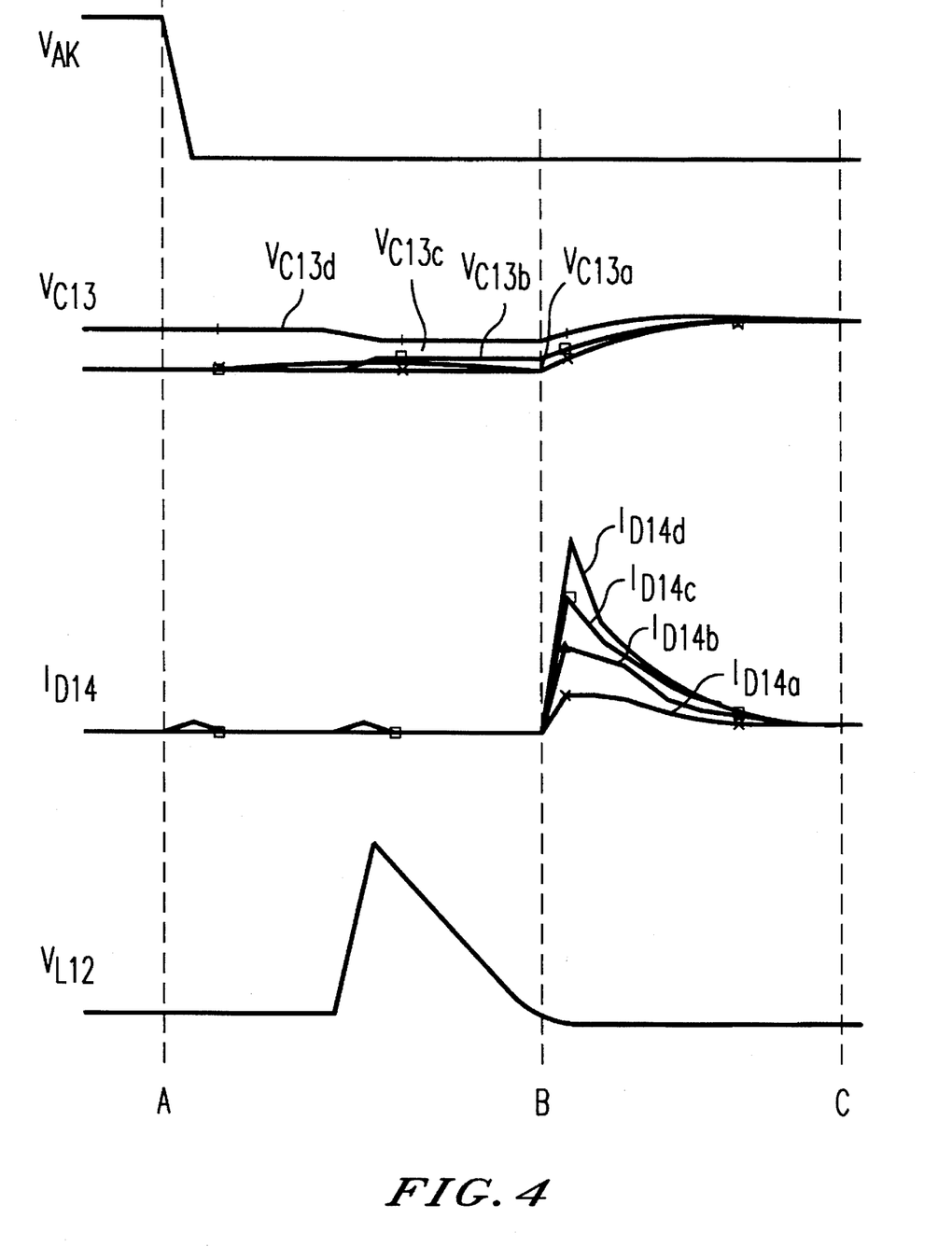
FIG. 4 is an operating waveform diagram given in explanation of the operation of the gate power supply circuit shown in FIG. 3.

At time point A in FIG. 4, GTOs 1a to 1d turn ON, and the voltages VAK of GTOs 1a to 1d drop. Simultaneously, first diodes 15a to 15d conduct. The charge of snubber capacitor 3d starts to be discharged by the loop: snubber capacitor 3d→GTO 1d→inductor 12→first capacitor 16→first diode 15d→snubber capacitor 3d. Also, the charge of snubber capacitor 3c is discharged by the loop: snubber capacitor 3c→GTO 1c→GTO 1d→inductor 12→first capacitor 16→first diode 15d→first diode 15c→first snubber capacitor 3c. The charge of snubber capacitor 3b is discharged by the loop: snubber capacitor 3b→GTO 1b→GTO 1c→GT0 1d→inductor 12→first capacitor 16→first diode 15d→first diode 15c→first diode 15b→snubber capacitor 3b. In the same way, the charge of snubber capacitor 3a is discharged by the loop: snubber capacitor 3a→GTO 1a→GTO 1b→GTO 1c→GTO 1d→inductor 12→first capacitor 16→first diode 15d first diode 15c→first diode 15b→first diode 15a→snubber capacitor 3a. Since voltages VAK of GTOs 1a to 1d rapidly approach zero, voltage VL12 of inductor 12 becomes the same as the voltage of snubber capacitors 3a to 3d which have become equivalently connected in parallel. Discharge of snubber capacitor 3a to 3d ceases at time point B. After time point B, the current of inductor 12 flows in the loops: inductor 12→first capacitor 16→first diode 15d→snubber diode 2d→inductor 12. The current of inductor 12 flows also in the loop d: inductor 12→second diode 14d→second capacitor 13d→inductor 12; furthermore, it flows in the loop c: inductor 12→second diode 14d→second diode 14c→second capacitor 13c→GTO 1d→inductor 12, in the loop b: inductor 12→ second diode 14d→second diode 14c→second diode 14b→ second capacitor 13b→GTO 1c→GTO 1d→inductor 12, and in the loop a: inductor 12→second diode 14d→second diode 14c→second diode 14b→second diode 14a→second capacitor 13a→GTO 1b→GTO 1c→GTO 1d→inductor 12. In this way, in second diode 14a, there flows the current that charges second capacitor 13a and, in second diode 14b, in addition to the current that charges second capacitor 13b, there flows the current that charges second capacitor 13a. In second diode 14c, there flows the currents that charge second capacitors 13c, 13b and 13a, respectively, and in second diode 14d, there flows the currents that charge second capacitors 13d, 13G, 13b and 13a, respectively. Consequently, as shown in FIG. 4, as one goes down through the four series-connected second diodes 14a to 14d, it will be found that these are passing progressively more currents ID14a to ID14d. Second capacitors 13a to 13d are thereby charged, and the respective voltages VC13a, VC13b, VC13c and VC13d of second capacitors 13a to 13d rise. At the time point C when the current of inductor 12 that flows due to the snubber energy has become zero, all of the energy of inductor 12 has completed its transfer to second capacitors 13a to 13d. The energy stored in first capacitor 16 is dissipated by resistor 17, and the energies stored in second capacitors 13a to 13d are respectively fed to gate drive circuits 7a to 7d.

The number of GTOs in FIG. 3 is four, but there is no restriction to four, and the arrangement can be put into practice with any number of GTOs connected in series.

In the embodiments so far described, the energy stored in first capacitor 16 was dissipated by resistor 17. This layout involves only a small number of components, but in particular in high voltage applications, results in considerable losses, lowering efficiency as a power converter.

Figure 5:
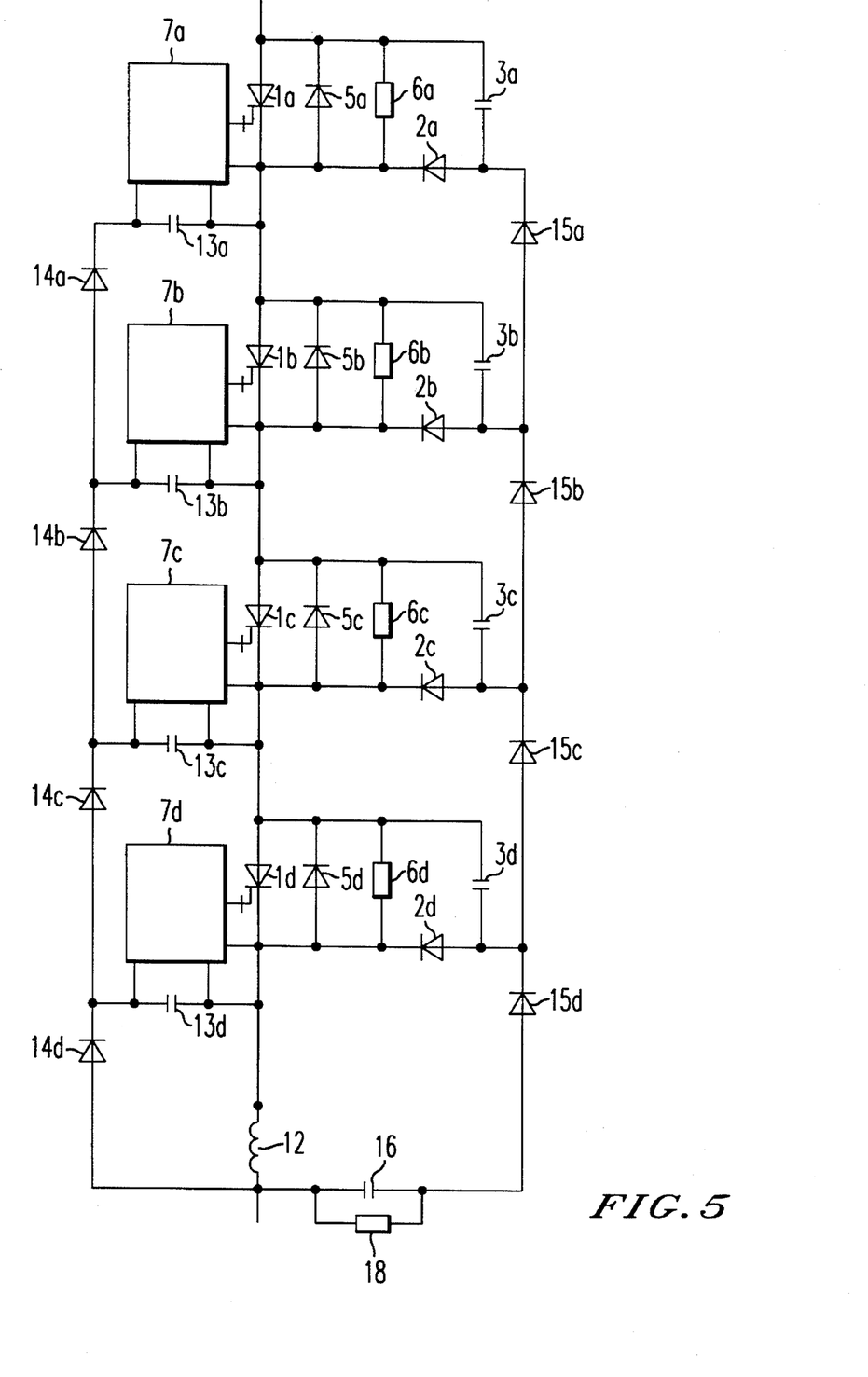
FIG. 5 is a layout diagram showing a gate power supply circuit according to a third embodiment this invention.

In order to reduce this drop in efficiency, the third embodiment of this invention, shown in FIG. 5 may be employed. In this embodiment, instead of resistor 17, use is made of a chopper or DC/DC converter or the like, so that the energy stored in first capacitor 16 can be regenerated.

In the third embodiment of this invention, shown in FIG. 5, instead of resistor 17 connected in parallel with first capacitor 16 in the second embodiment of this invention shown in FIG. 3, there is provided a snubber energy regeneration circuit 18 constituted by a chopper or DC/DC converter or the like. The construction of the snubber energy regeneration circuit 18 is well known to those skilled it the art, so that the detailed description thereof may by omitted, The rest of the layout is the same as FIG. 3. The operation of this third embodiment therefore differs only in that the energy stored in first capacitor 16 is regenerated at the power source side of load side by snubber energy regenerating circuits 18. With such a layout, the voltage of first capacitor 16 is controlled by the action of snubber energy regenerating circuit 18 such as to be a fixed voltage, In this invention, the energy stored in the snubber capacitor of the switching device in the OFF period of the switching device provides the source of the drive power of the gate drive circuit. Therefore, after the power source of the power converter is connected, gate drive power will not be supplied until the switching device commences its switching action. Where there are many switching devices, not much power is required to turn them ON. In particular, in the case of an IGBT or MCT, which is an MOS gate type switching device, practically no gate power is required for turn ON. Initial turn ON i.e. first turn ON after power source connection, can therefore be arranged to be performed by extracting only a slight gate power from an optical signal using for example a photovoltaic element, it being arranged for the gate power to be supplied subsequently from the gate power supply circuit of this invention.

However, this method is difficult to apply in the case of switching devices such as GTOs. This is because most GTOs need a certain amount of gate power to provide negative bias to the gate even when the GTO is OFF.

Figure 6:
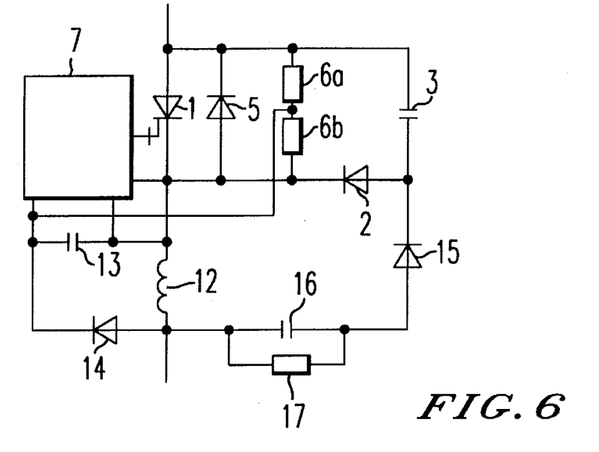
FIG. 6 is a layout diagram showing a gate power supply circuit according to a fourth embodiment of this invention.

FIG. 6 is a layout diagram showing a gate power supply circuit according to a fourth embodiment of this invention adapted for such cases. In this embodiment, instead of DC balance resistor 6 in the embodiment of FIG. 1, a voltage dividing-circuit consisting of voltage-dividing resistors 6a and 6b connected in series is connected in parallel with GTO 1, so that second capacitor 13 is charged during the OFF period of GTO 1. In this way, gate power is supplied through the voltage-dividing circuit before GTO 1 begins switching. In FIG. 6, voltage-dividing resistors 6a and 6b also perform the role of balance resistor of GTO 1. Of course, there would be no problem in providing a balance resistor apart from voltage-dividing resistors 6a and 6b, but, from the point of view of space and cost, it is advantageous to combine these functions. In FIG. 6, the voltage obtained by the voltage division of voltage dividing-resistors 6a and 6b is supplied to gate drive circuit 7 before GTO 1 starts switching. However, if the dissipation current of gate drive circuit 7 is considered, voltage division may not necessarily be essential, and it may be possible to achieve the object simply by passing current through the resistor.

Figure 7:
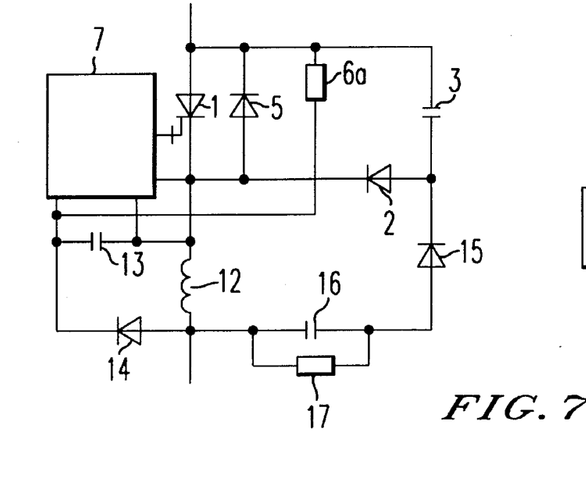
FIG. 7 is a layout diagram showing a gate power supply circuit according to a fifth embodiment of this invention.

FIG. 7 is a layout diagram showing a gate power supply circuit according to a fifth embodiment of this invention for use in such a case.

The current that flows through resistor 6c before GTO 1 starts switching constitutes the power source of gate drive circuit 7. In this case, a suitable voltage stabilizing means must be incorporated on the side of the gate drive circuit 7, but this can easily be implemented and need not therefore be shown as a practical example.

If gate drive circuit 7 incorporates a voltage stabilizing means, some fluctuation of the source voltage of gate drive circuit 7 can be permitted. In this case, first capacitor 16 of the embodiment of FIG. 1 is not necessarily essential. The reason for this is that first capacitor 16 serves for receiving the energy stored in inductor 12; once it has been received in first capacitor 16, it is dissipated by resistor 17 or it should be regenerated by a DC/DC converter or the like; there is therefore no problem in allowing the energy to be directly dissipated by resistor 17 without passing through first capacitor 16.

Figure 8:
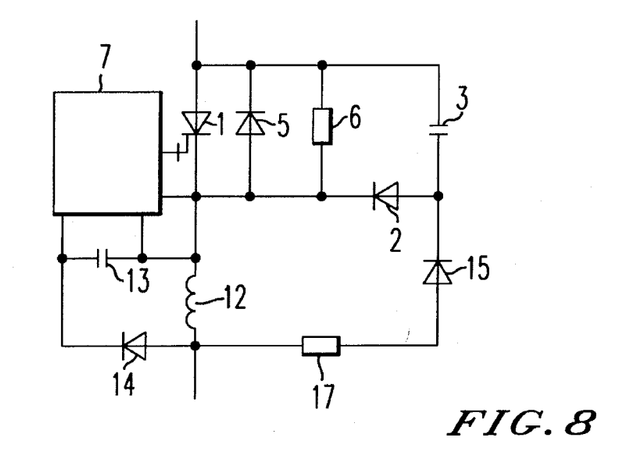
FIG. 8 is a layout diagram showing a gate power supply circuit according to a sixth embodiment of this invention.

FIG. 8 is a layout diagram showing a gate power supply circuit according to a sixth embodiment of this invention based on this concept. The embodiment of FIG. 8 is characterized in that, compared with the embodiment of FIG. 1, first capacitor 16 is not provided and the energy is directly dissipated by resistor 17. As already mentioned, the larger first capacitor 16 is made, the more stable will its voltage be, so if on the other hand first capacitor 16 is absent, there will be considerable fluctuation of the source voltage of gate drive circuit 7. However, this can be allowed, due to the provision of voltage stabilizing means within gate drive circuit 7.

The sixth embodiment is particularly beneficial where, in the case of a low-snubber GTO with small capacity of snubber capacitor 3, there is no energy worth returning for regeneration, so first capacitor 16 is omitted and resistor 17 can be provided.

It should be noted that, although in the above explanation, examples using GTOs as switching devices have been described, this invention in not restricted to GTOs as switching devices and could be employed with other self-turn-off devices.

Furthermore, although in the above description the switching device is taken as being a GTO, so 7 is its gate drive circuit, transistors or the like could also be employed as switching devices. The gate drive circuit therefore includes, the circuits to which this invention could be applied, for example, fault detection circuits with switching devices attached, or control and protection circuits etc. for high potential units. In this invention, these are designated by the general term "gate drive circuit or the like".

Yet further, although this invention is entitled "Gate power supply circuit", as mentioned above, this invention can also be applied to the case where transistors or the like are employed as switching devices, so the term "gate power supply circuit" is intended to include circuitry whereby switching devices such as transistors are controlled.

As described above, with the gate power supply circuit according to this invention, energy is obtained from the main circuit side utilizing the switching action of switching devices located in the main circuit, so the energy stored in the snubber capacitor during the off period of the switching device is transferred to a power supplying capacitor, such as a second capacitor, through an inductor during the ON period of the switching device, thereby enabling the energy stored in this second capacitor to be utilized; the large number of isolating transformers of high withstand voltage that were necessary in the prior art are thereby made unnecessary, enabling miniaturization and cost reduction of a power converter constructed using self-turn-off devices.

Obviously, numerous modifications and variations of the present invention are possible in light of the above teachings. It is therefore to be understood that within the scope of the appended claims, the invention may be practiced otherwise than as specifically described herein.

What is claimed is:

1. A gate power supply circuit, comprising:

a switching device;

gate drive circuit means connected to said switching device for generating a gate signal to be supplied to a gate of said switching device;

a series circuit of a snubber capacitor and a snubber diode connected in parallel with said switching device;

an inductor, a first terminal of which being connected to a connection point of said switching device and said snubber diode;

a series circuit of power disposing means and a first diode, connected between a series connection point of said snubber capacitor and said snubber diode and a second terminal of said inductor; and a series circuit of a power supplying capacitor and a second diode, connected in parallel with said inductor;

said gate drive circuit means being connected to said power supplying capacitor to receive energy stored in said power supplying capacitor as power source for said gate drive circuit means.

2. The gate power supply circuit according to claim 1, wherein:

said power disposing means includes a parallel circuit of a capacitor and a resistor.

3. The gate power supply circuit according to claim 1, wherein:

said power disposing means includes a parallel circuit of a capacitor and a snubber energy regeneration circuit.

4. The gate power supply circuit according to claim 1, wherein:

said power disposing means includes a resistor.

5. The gate power supply circuit according to claim 1, further comprising:

a first resistor connected between a connection point of said power supplying capacitor and said second diode and a connection point of said switching device and said snubber capacitor, for charging said power supplying capacitor.

6. The gate power supply circuit according to claim 5, further comprising:

a second resistor connected between said connection point of said power supplying capacitor and said second diode and said connection point of said switching device and said snubber diode.

7. The gate power supply circuit according to claim 1, further comprising:

a DC balance resistor connected in parallel with said switching device.

8. The gate power supply circuit according to claim 1, further comprising:

a free-wheeling diode connected in anti-parallel with said switching device.

9. A gate power supply circuit, comprising:

a plurality of valve unit means;

an inductor having a first terminal and a second terminal; and power disposing means, a first terminal of which being connected to said second terminal of said inductor;

each of said valve unit means including,
  a switching device,
  gate drive circuit means connected to said switching device for generating a gate signal to be supplied to a gate of said switching device,
  a series circuit of a snubber capacitor and a snubber diode connected in parallel with said switching device,
  a first diode, a first terminal of which being connected to a series connection point of said snubber capacitor and said snubber diode, and
  a series circuit of a power supplying capacitor and a second diode 14a–14d, a first terminal of said power supplying capacitor being connected to a connection point of said switching device and said snubber diode, a second terminal of said power supplying capacitor being connected to a first terminal of said second diode, said gate drive circuit means being connected to said power supplying capacitor to receive energy stored in said power supplying capacitor as power source for said gate drive circuit means;

a plurality of said valve unit means and said inductor being connected in series such that, a plurality of said switching devices are connected in series, and said inductor is connected in series with said series connected switching devices such that said first terminal of said inductor is connected to said connection point of said switching device and said snubber diode of said valve unit means in a last stage;

a second terminal of said first diode of said valve unit means in a stage except said last stage is connected to said first terminal of said first diode of said valve unit means in a next stage, and a second terminal of said first diode of said valve unit means in said last stage is connected to a second terminal of said power disposing means, and a second terminal of said second diode of said valve unit means in said stage except said last stage is connected to said first terminal of said second diode of said valve unit means in said next stage, and a second terminal of said second diode of said valve unit means in said last stage is connected to a second terminal of said inductor.

10. The gate power supply circuit according to claim 9, wherein:

said power disposing means includes a parallel circuit of a capacitor and a resistor.

11. The gate power supply circuit according to claim 9, wherein:

said power disposing means includes a parallel circuit of a capacitor and a snubber energy regeneration circuit.

\* \* \* \* \*